United States Patent
Gutsche et al.

(10) Patent No.: US 7,864,579 B2
(45) Date of Patent: Jan. 4, 2011

(54) INTEGRATED CIRCUITS HAVING A CONTROLLER TO CONTROL A READ OPERATION AND METHODS FOR OPERATING THE SAME

(75) Inventors: Jan Gutsche, Munich (DE); Michael Scheppler, Munich (DE); Gert Koebernik, Unterhaching (DE); Detlev Richter, Munich (DE)

(73) Assignee: Qimonda AG, Munich (DE)

( * ) Notice: Subject to any disclaimer, the term of this patent is extended or adjusted under 35 U.S.C. 154(b) by 148 days.

(21) Appl. No.: 12/178,912

(22) Filed: Jul. 24, 2008

(65) Prior Publication Data

US 2010/0020610 A1 Jan. 28, 2010

(51) Int. Cl.
*G11C 11/34* (2006.01)
*G11C 16/04* (2006.01)
*G11C 16/06* (2006.01)
*G11C 8/00* (2006.01)

(52) U.S. Cl. .......................... 365/185.09; 365/185.11; 365/185.29; 365/230.03

(58) Field of Classification Search ............ 365/185.09, 365/185.11, 185.29, 230.03
See application file for complete search history.

(56) References Cited

U.S. PATENT DOCUMENTS

| 5,790,459 | A | * | 8/1998 | Roohparvar | ............ 365/185.21 |
| 7,610,257 | B1 | * | 10/2009 | Abrahams | ..................... 706/62 |
| 2003/0002362 | A1 | * | 1/2003 | Frankowsky | ................ 365/200 |
| 2006/0221728 | A1 | * | 10/2006 | Fasoli et al. | ................. 365/200 |
| 2007/0159906 | A1 | * | 7/2007 | Nakashima et al. | ......... 365/222 |
| 2008/0286955 | A1 | * | 11/2008 | Shuy | .......................... 438/584 |

* cited by examiner

*Primary Examiner*—Ly D Pham

(57) ABSTRACT

In an embodiment, an integrated circuit having a memory cell arrangement is provided. The memory cell arrangement may include a memory cell block having a plurality of memory cells, a storage portion configured to store information about a quality characteristic of the memory cells of the memory cell block, and a controller configured to control a read operation, and to change the information about the quality characteristic depending on a quality of a read operation.

4 Claims, 12 Drawing Sheets

_US 7,864,579 B2_

INTEGRATED CIRCUITS HAVING A CONTROLLER TO CONTROL A READ OPERATION AND METHODS FOR OPERATING THE SAME

TECHNICAL FIELD

Embodiments relate generally to integrated circuits having a controller to control a read operation and to methods for operating the same.

BACKGROUND

In the context of memory cell block management in a memory cell arrangement, conventionally, a memory cell block is marked as a bad memory cell block (in other words, as a memory cell block not working properly), if a program operation or an erase operation fails. For future developments, this way of memory cell block management will probably not be sufficient since it is likely that the number of initially failing memory cells (or the number of initially failing bits) will increase.

In another conventional memory cell arrangement, a program-erase counter is provided counting for each memory cell block the number of program and erase operations carried out on the respective memory cell block. If the counter value of the counter exceeds a predefined threshold value for a memory cell block, the respective memory cell block is marked as a bad memory cell block.

SUMMARY OF THE INVENTION

In an embodiment, an integrated circuit having a memory cell arrangement is provided. The memory cell arrangement may include a memory cell block having a plurality of memory cells, a storage portion configured to store information about a quality characteristic of the memory cells of the memory cell block, and a controller configured to control a read operation, and to change the information about the quality characteristic depending on a quality of a read operation.

In another embodiment, an integrated circuit having a memory cell arrangement is provided. The memory cell arrangement may include a memory cell block including a plurality of memory cells, a memory region configured to store information about a read failure characteristic of the memory cells of the memory cell block, and a controller configured to control a read operation such that in case the read operation fulfills a first predefined read criterion, the information about the read failure characteristic of the memory cells of the memory cell block is changed in a predefined manner, and such that in case the information about the read failure characteristic of the memory cells of the memory cell block fulfills a second predefined read criterion, a predefined first action is carried out for the memory cell block.

In yet another embodiment, an integrated circuit having a memory cell arrangement is provided. The memory cell arrangement may include a memory cell block including a plurality of memory cells, a storage portion configured to store information about a read failure characteristic of the memory cells of each memory cell block of the plurality of memory cell blocks, and a controller configured to control a read operation on memory cells of a memory cell block out of the plurality of memory cell blocks such that a current read failure characteristic of the memory cells of the memory cell block is determined, and such that depending on the stored read failure characteristic of the memory cells of the read memory cell block and depending on the determined current read failure characteristic of the memory cells of the memory cell block, a predefined first action is carried out for the memory cell block.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which.

DETAILED DESCRIPTION OF ILLUSTRATIVE EMBODIMENTS

Figure 1:
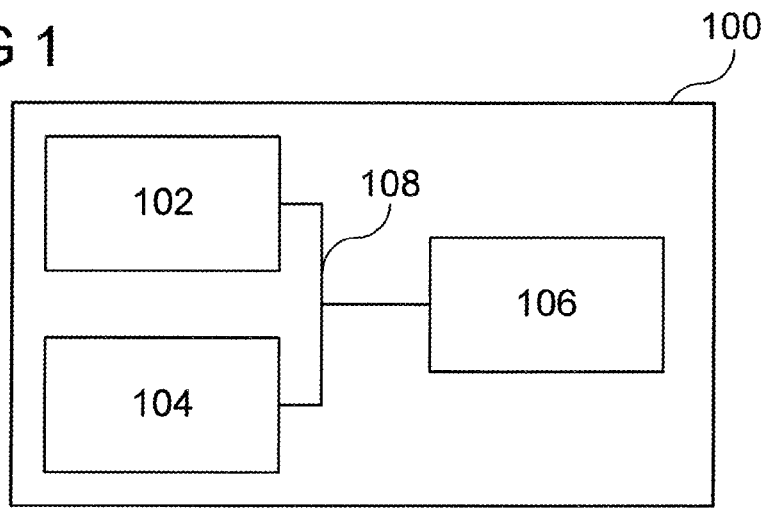
FIG. 1 shows a memory cell arrangement in accordance with an embodiment.

FIG. 1 shows a memory cell arrangement 100 in accordance with an embodiment. The memory cell arrangement 100 may be included in an integrated circuit. In an embodiment, the memory cell arrangement 100 may include one or more memory cell blocks 102, each memory cell block 102 having a plurality of memory cells, and a storage portion 104 configured to store information about a quality characteristic of the memory cells of the memory cell block. In an alternative embodiment, the storage portion 104 may be configured to store information about a read failure characteristic of the memory cells of the respective memory cell block 102.

The memory cell arrangement 100 may further include a controller 106 configured to control a read operation, and to change the information about the quality characteristic depending on a quality of a read operation. In an alternative embodiment, the controller 106 may be configured to control a read operation such that in case the read operation fulfills a first predefined read criterion, the information about the read failure characteristic of the memory cells of the memory cell block is changed in a predefined manner, and such that in case the information about the read failure characteristic of the memory cells of the memory cell block fulfills a second predefined read criterion, a predefined first action is carried out for the memory cell block. The memory cell blocks 102, the storage portion 104 and the controller 106 may be coupled with each other by means of one or a plurality of computer arrangement-internal connections 108 (for example, by means of one or a plurality of computer busses) configured to transmit data and/or control signals between the respectively coupled circuits or components.

In an example of these embodiments, the memory cell arrangement 100 may include a plurality of memory cell blocks 102, each memory cell block 102 having a plurality of memory cells. Furthermore, the storage portion 104 may be configured to store information about a read failure characteristic of the memory cells of each memory cell block 102 of the plurality of memory cell blocks 102. In another example of these embodiments, the memory cells may be a type of memory cells which are subject to a read disturb failure and/or a type of memory cells which are subject to a retention failure. In another example of these embodiments, the memory cells may be charge storing memory cells (e.g., charge trapping memory cells or floating gate memory cells). In yet another example of these embodiments, the information about a read failure characteristic of the memory cells of the memory cell block 102 may be an information that is dependent on a number of read failing memory cells of the memory cell block 102. In yet another example of these embodiments, the storage portion 104 may include a counter, wherein the counter value may be dependent on a number of read failing memory cells of the memory cell block 102. In yet another example of these embodiments, the storage portion 104 may include a plurality of counters, wherein each counter may be assigned to a respective memory cell block 102, and wherein the counter value of a respective counter may be dependent on a number of read failing memory cells of the assigned memory cell block 102. In yet another example of these embodiments, the counter value may be set to an initial counter value that is dependent from an initial characteristic of the memory cells of the memory cell block 102. In yet another example of these embodiments, the counter value may be set to an initial counter value that is dependent from a predetermined quality characteristic of the memory cells of the memory cell block 102. In yet another example of these embodiments, the first predefined read criterion may be a predefined threshold number of read failing memory cells of the memory cell block 102. In yet another example of these embodiments, the second predefined read criterion may be a predefined counter value threshold. In yet another example of these embodiments, the controller 106 may be configured to control a read operation such that in case the information about the read failure characteristic of the memory cells of the memory cell block 102 fulfills the second predefined read criterion, the memory cell block 102 is mapped to another memory cell block 102. In yet another example of these embodiments, the controller 106 may further be configured to control an erase operation such that the information about the read failure characteristic of the memory cells of the memory cell block 102 is changed in a predefined manner in accordance with an erase operation characteristic, and such that in case information about the read failure characteristic of the memory cells of the memory cell block 102 fulfills a predefined erase criterion, a predefined second action is carried out for the memory cell block 102. In yet another example of these embodiments, the erase operation characteristic may be a number of erase pulses used for erasing the memory cells of the memory cell block 102. In yet another example of these embodiments, the controller 106 may be configured to control an erase operation such that in case the information about the read failure characteristic of the memory cells of the memory cell block 102 fulfills the predefined second erase criterion, the memory cell block 102 is classified as a bad memory cell block.

It is to be noted that in various embodiments, the "behavior" or quality of the memory cells of the memory cell blocks can be monitored, which allows to determine how much memory cell blocks are deteriorating until shortly before they finally fail. For example, these characteristics may be monitored with time in order to get a better understanding of their functionality. This may substantially improve the lifetime and usage of the memory cell blocks and thus the entire memory cell arrangement.

Figure 2:
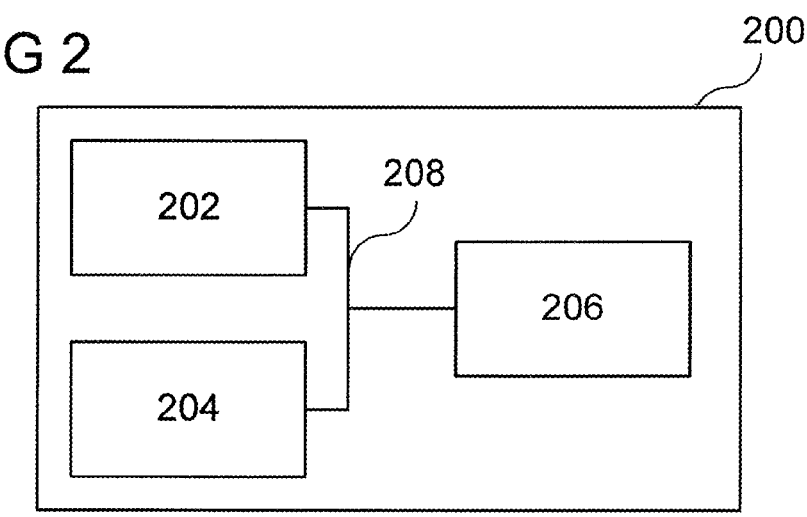
FIG. 2 shows a memory cell arrangement in accordance with another embodiment.

FIG. 2 shows a memory cell arrangement 200 in accordance with an embodiment. The memory cell arrangement 200 may be included in an integrated circuit. In an embodiment, the memory cell arrangement 200 may include one or more memory cell blocks 202, each memory cell block 202 having a plurality of memory cells, and a storage portion 204 configured to store information about a read failure characteristic of the memory cells of each memory cell block of the plurality of memory cell blocks. Furthermore, the memory cell arrangement 200 may include a controller 206 configured to control a read operation on memory cells of a memory cell block 202 out of the plurality of memory cell blocks 202 such that a current read failure characteristic of the memory cells of the memory cell block 202 is determined, and such that depending on the stored read failure characteristic of the memory cells of the read memory cell block 202 and depending on the determined current read failure characteristic of the memory cells of the memory cell block 202, a predefined first action is carried out for the memory cell block 202. The memory cell blocks 202, the storage portion 204 and the controller 206 may be coupled with each other by means of one or a plurality of computer arrangement-internal connections 208 (for example by means of one or a plurality of computer busses) configured to transmit data and/or control signals between the respectively coupled circuits or components.

In an example of this embodiment, the memory cells may be a type of memory cells which are subject to a read disturb failure and/or a type of memory cells which are subject to a retention failure. In another example of this embodiment, the memory cells may be charge storing memory cells (e.g., charge trapping memory cells or floating gate memory cells). In yet another example of this embodiment, the information about a read failure characteristic of the memory cells of a respective memory cell block 202 may be an information that is dependent on a number of read failing memory cells of the respective memory cell block 202. In yet another example of this embodiment, the storage portion 204 may include a plurality of counters, wherein each counter may be assigned to a respective memory cell block 202, and wherein the counter value of a respective counter is dependent on a number of read failing memory cells of the assigned memory cell block 202. In yet another example of this embodiment, the counter value of a respective counter may be set to an initial counter value that is dependent on a predetermined characteristic of the memory cells of the assigned memory cell block 202. In yet another example of this embodiment, the counter value of a respective counter may be set to an initial counter value that is dependent on a predetermined quality characteristic of the memory cells of the assigned memory cell block 202. In yet another example of this embodiment, the controller 206 may be configured to control a read operation on memory cells of a memory cell block out of the plurality of memory cell blocks such that the number of read failing memory cells of the memory cell block 202 is determined, and such that the predefined first action is carried out for the memory cell block 202 depending on whether the number of read failing memory cells of the memory cell block exceeds a predefined threshold number of read failing memory cells of the memory cell block. In yet another example of this embodiment, the controller 206 may be configured to control a read operation such that the predefined first action is a mapping of the memory cell block 202 to another memory cell block. In yet another example of this embodiment, the controller 206 may be further configured to control an erase operation on memory cells of a memory cell block 202 out of the plurality of memory cell blocks 202 such that a current erase characteristic of the memory cells of the memory cell block 202 is determined, and such that further depending on the determined current erase characteristic of the memory cells of the memory cell block 202, a predefined second action is carried out for the memory cell block. In yet another example of this embodiment, the erase characteristic may be a number of erase pulses used for erasing the memory cells of the memory cell block 202. In yet another example of this embodiment, the controller 206 may be configured to control an erase operation such that the predefined second action is a classification of the memory cell block 202 as a bad memory cell block.

Figure 3:
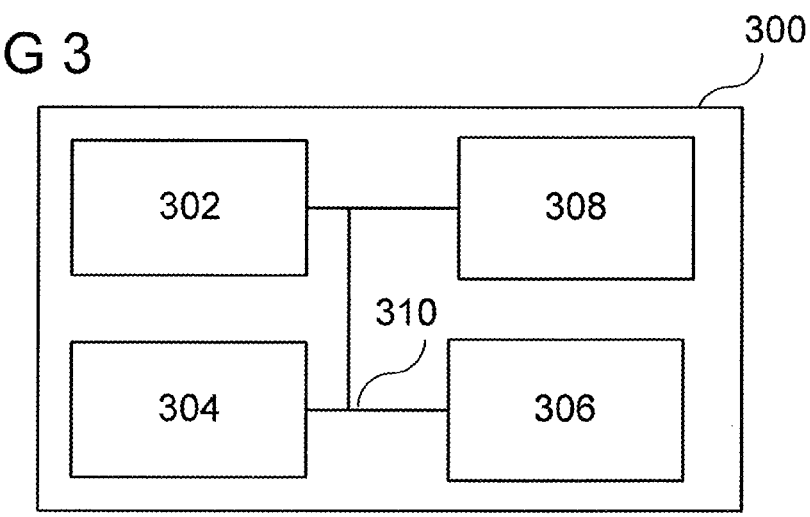
FIG. 3 shows a memory cell arrangement in accordance with yet another embodiment.

FIG. 3 shows a memory cell arrangement 300 in accordance with an embodiment. The memory cell arrangement 300 may be included in an integrated circuit. In an embodiment, the memory cell arrangement 300 may include one or more memory cell blocks 302, each memory cell block 302 having a plurality of memory cells, and a storage portion 304 configured to store information about a read failure characteristic of the memory cells of each memory cell block of the plurality of memory cell blocks. Furthermore, the memory cell arrangement 300 may include a controller 306 configured to control a read operation on memory cells of a memory cell block out of the plurality of memory cell blocks such that a current read failure characteristic of the memory cells of the memory cell block is determined, and a wear leveling circuit 308 configured to select memory cell blocks 302 for programming dependent on the stored (e.g., stored in the memory region 304) information about a read failure characteristic of the memory cells of each memory cell block 302 of the plurality of memory cell blocks 302. The memory cell blocks 302, the storage portion 304, the controller 306, and the wear leveling circuit 308 may be coupled with each other by means of one or a plurality of computer arrangement-internal connections 310 (for example, by means of one or a plurality of computer busses) configured to transmit data and/or control signals between the respectively coupled circuits or components.

Figure 4:
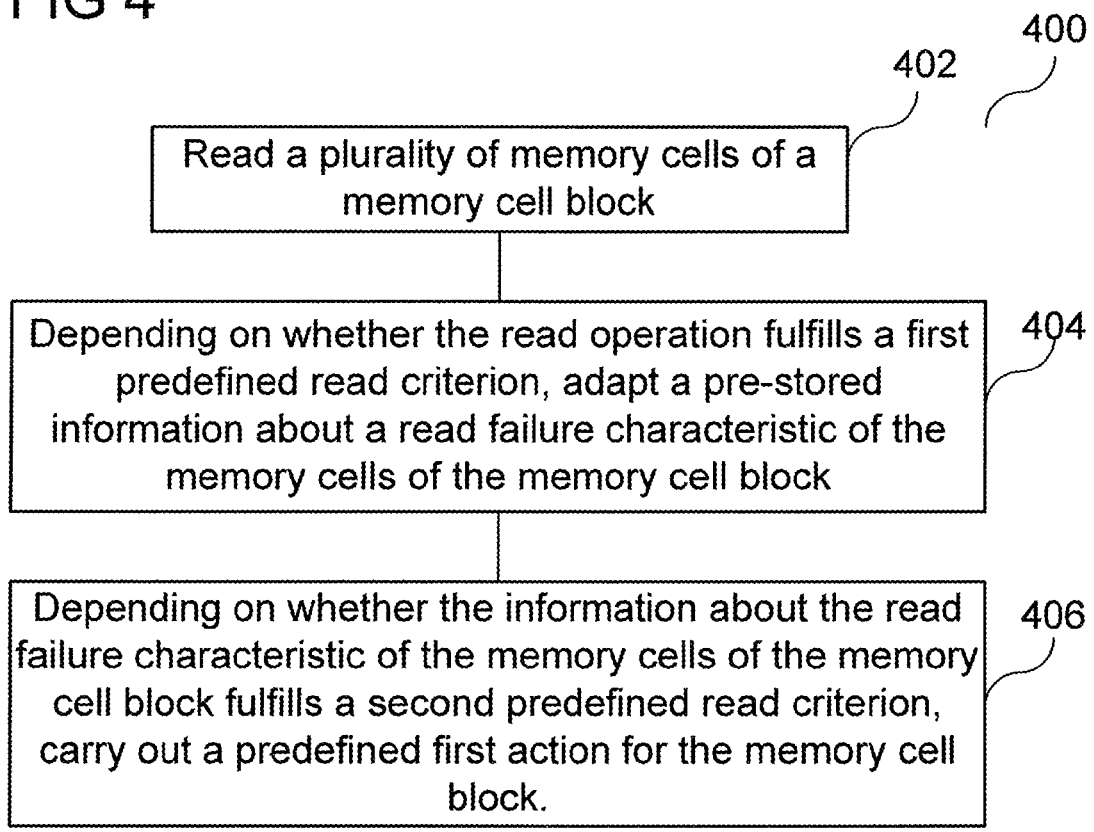
FIG. 4 shows a method for operating an integrated circuit in accordance with an embodiment.

FIG. 4 shows a method 400 for operating an integrated circuit accordance with an embodiment. In 402, a plurality of memory cells of a memory cell block may be read. Then, in 404, depending on whether the read operation fulfills a first predefined read criterion, a pre-stored information about a read failure characteristic of the memory cells of the memory cell block may be changed. In 406, depending on whether the information about the read failure characteristic of the memory cells of the memory cell block fulfills a second predefined read criterion, a predefined first action for the memory cell block may be carried out.

In an example of this embodiment, the method may further include pre-storing information about a read failure characteristic of the memory cells of each memory cell block of a plurality of memory cell blocks. In another example of this embodiment, the memory cells may be a type of memory cells which are subject to a read disturb failure and/or a type of memory cells which are subject to a retention failure. In yet another example of this embodiment, the memory cells may be charge storing memory cells (e.g., charge trapping memory cells or floating gate memory cells). In yet another example of this embodiment, the information about a read failure characteristic of the memory cells of the memory cell block may be an information that is dependent on a number of read failing memory cells of the memory cell block. In yet another example of this embodiment, the method may further include providing a counter, wherein the counter value may be set dependent on a number of read failing memory cells of the memory cell block. In yet another example of this embodiment, the method may further include providing a plurality of counters, wherein each counter is assigned to a respective memory cell block, and wherein the counter value of a respective counter may be set dependent on a number of read failing memory cells of the assigned memory cell block. In yet another example of this embodiment, the counter value may be set to an initial counter value that is dependent from a predetermined characteristic of the memory cells of the memory cell block. In yet another example of this embodiment, the counter value is set to an initial counter value that is dependent from a predetermined quality characteristic of the memory cells of the memory cell block. In yet another example of this embodiment, the first predefined read criterion may be a predefined threshold number of read failing memory cells of the memory cell block. In yet another example of this embodiment, the second predefined read criterion may be a predefined counter value threshold. In yet another example of this embodiment, a read operation may be controlled such that in case the information about the read failure characteristic of the memory cells of the memory cell block fulfills the second predefined read criterion, the memory cell block is mapped to another memory cell block. In yet another example of this embodiment, the method may further include controlling an erase operation such that the information about the read failure characteristic of the memory cells of the memory cell block is changed in a predefined manner in accordance with an erase operation characteristic, and such that in case information about the read failure characteristic of the memory cells of the memory cell block fulfills a predefined erase criterion, a predefined second action is carried out for the memory cell block. In yet another example of this embodiment, the erase operation characteristic may be a number of erase pulses used for erasing the memory cells of the memory cell block. In yet another example of this embodiment, an erase operation may be controlled such that in case the information about the read failure characteristic of the memory cells of the memory cell block fulfills the predefined second erase criterion, the memory cell block is classified as a bad memory cell block.

Figure 5:
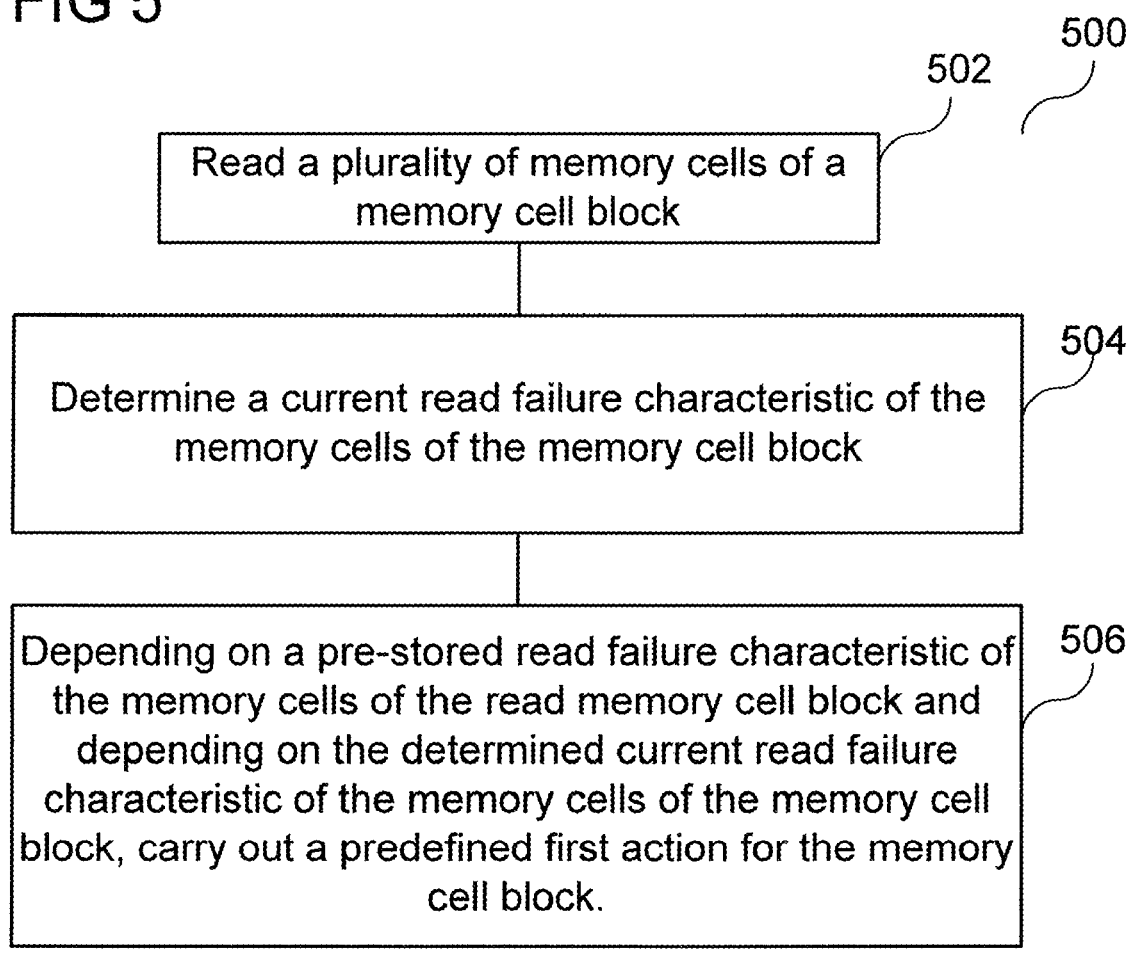
FIG. 5 shows a method for operating an integrated circuit in accordance with another embodiment.

FIG. 5 shows a method 500 for operating an integrated circuit accordance with an embodiment. In 502, a plurality of memory cells of a memory cell block which includes a plurality of memory cells may be read. In an example, all of the memory cells of the memory cell block may be read in 502. In 504, a current read failure characteristic of the memory cells of the memory cell block may be determined. In 506, depending on a pre-stored read failure characteristic of the memory cells of the read memory cell block and depending on the determined current read failure characteristic of the memory cells of the memory cell block, a predefined first action for the memory cell block may be carried out.

In an example of this embodiment, the memory cells may be a type of memory cells which are subject to a read disturb failure and/or a type of memory cells which are subject to a retention failure. In another example of this embodiment, the memory cells may be charge storing memory cells (e.g., charge trapping memory cells or floating gate memory cells). In yet another example of this embodiment, the information about a read failure characteristic of the memory cells of a respective memory cell block may be an information that is dependent on a number of read failing memory cells of the respective memory cell block. In yet another example of this embodiment, the method may further include providing a plurality of counters, wherein each counter is assigned to a respective memory cell block, and wherein the counter value of a respective counter may be set dependent on a number of read failing memory cells of the assigned memory cell block. In yet another example of this embodiment, the counter value of a respective counter may be set to an initial counter value that is dependent from a predetermined characteristic of the memory cells of the assigned memory cell block. In yet another example of this embodiment, the counter value of a respective counter may be set to an initial counter value that is dependent from a predetermined quality characteristic of the memory cells of the assigned memory cell block. In yet another example of this embodiment, a read operation on memory cells of a memory cell block out of the plurality of memory cell blocks may be controlled such that the number of read failing memory cells of the memory cell block is determined, and such that the predefined first action is carried out for the memory cell block depending on whether the number of read failing memory cells of the memory cell block exceeds a predefined threshold number of read failing memory cells of the memory cell block. In yet another example of this embodiment, a read operation may be controlled such that the predefined first action is a mapping of the memory cell block to another memory cell block. In yet another example of this embodiment, the method may further include controlling an erase operation on memory cells of a memory cell block out of the plurality of memory cell blocks such that a current erase characteristic of the memory cells of the memory cell block is determined, and such that further depending on the determined current erase characteristic of the memory cells of the memory cell block, a predefined second action is carried out for the memory cell block. In yet another example of this embodiment, the erase characteristic may be a number of erase pulses used for erasing the memory cells of the memory cell block. In yet another example of this embodiment, an erase operation may be controlled such that the predefined second action is a classification of the memory cell block as a bad memory cell block.

Figure 6:
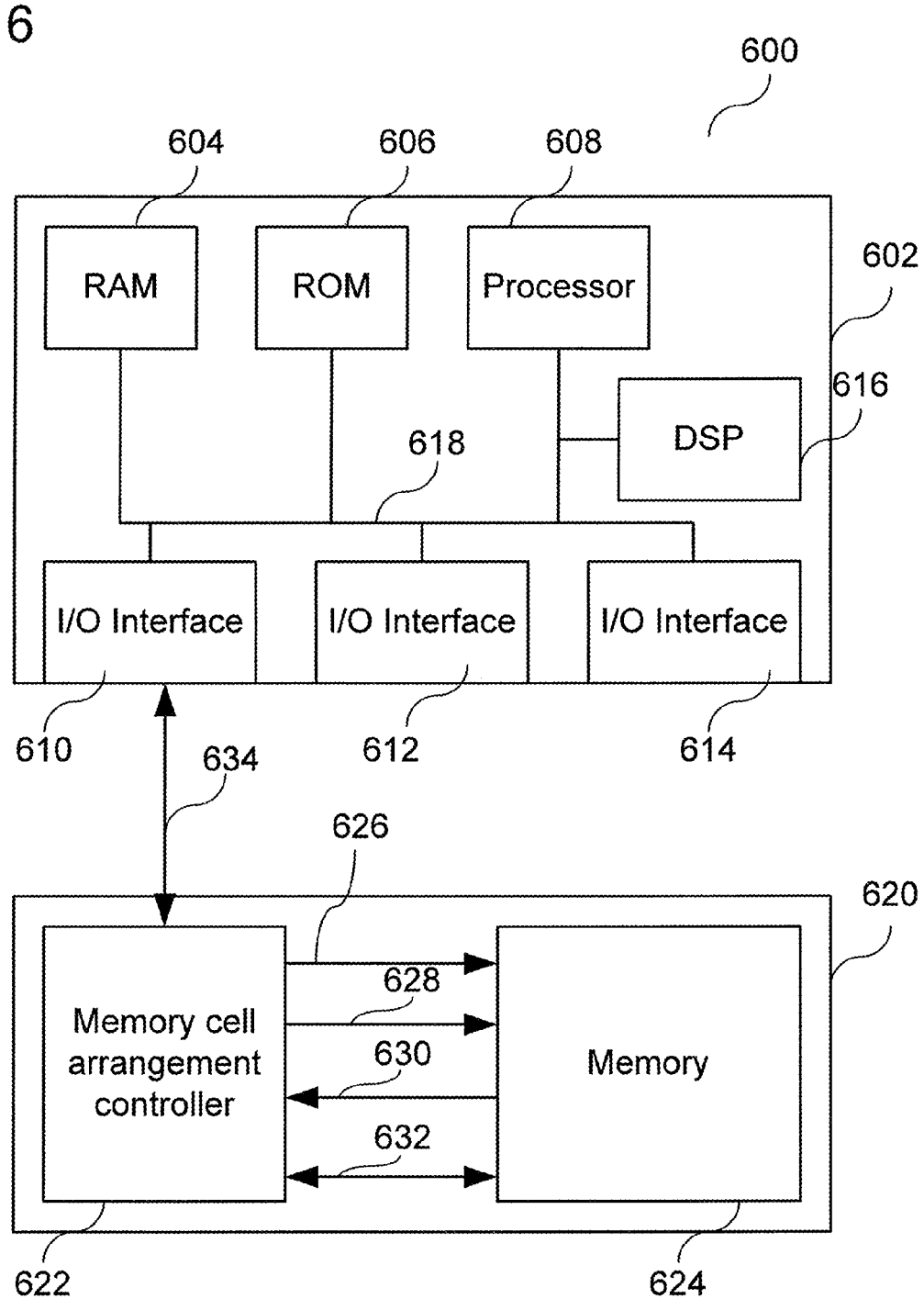
FIG. 6 shows a computer system having a memory cell arrangement in accordance with an embodiment.

FIG. 6 shows a computer system 600 having a computer arrangement 602 and a memory cell arrangement 620 in accordance with an embodiment.

In various embodiments, the computer arrangement 602 may be configured as or may include any device having a processor, e.g., having a programmable processor such as e.g. a microprocessor (e.g., a CISC (complex instruction set computer) microprocessor or a RISC (reduced instruction set computer) microprocessor). In various embodiments, the computer arrangement 602 may be configured as or may include a personal computer, a workstation, a laptop, a notebook, a personal digital assistant (PDA), a radio telephone (e.g., a wireless radio telephone or a mobile radio telephone), a camera (e.g., an analog camera or a digital camera), a navigation system, or another device having a processor (such as, e.g., a household appliance (such as, e.g., a washing machine, a dishwashing machine, etc.))

In an embodiment, the computer arrangement 602 may include one or a plurality of computer arrangement-internal random access memories (RAM) 604, e.g., one or a plurality of computer arrangement-internal dynamic random access memories (DRAM), in which for example data to be processed may be stored. Furthermore, the computer arrangement 602 may include one or a plurality of computer arrangement-internal read only memories (ROM) 606, in which, for example, the program code may be stored, which should be executed by a processor 608 (e.g., a processor as described above), which may also be provided in the computer arrangement 602.

Furthermore, in an embodiment, one or a plurality of input/output interfaces 610, 612, 614 (in FIG. 6, there are shown three input/output interfaces, in alternative embodiments, e.g., one, two, four, or even more than four input/output interfaces may be provided) configured to connect one or a plurality of computer arrangement-external devices (such as, e.g., additional memory, one or a plurality of communication devices, one or a plurality of additional processors) to the computer arrangement 602, may be provided in the computer arrangement 602.

The input/output interfaces 610, 612, 614 may be implemented as analog interfaces and/or as digital interfaces. The input/output interfaces 610, 612, 614 may be implemented as serial interfaces and/or as parallel interfaces. The input/output interfaces 610, 612, 614 may be implemented as one or a plurality of circuits, which implements or implement a respective communication protocol stack in its functionality in accordance with the communication protocol which is respectively used for data transmission. Each of the input/output interfaces 610, 612, 614 may be configured in accordance with any communication protocol. In an embodiment, each of the input/output interfaces 610, 612, 614 may be implemented in accordance with one of the following communication protocols:

an ad hoc communication protocol such as, e.g., Firewire or Bluetooth;

a communication protocol for a serial data transmission such as, e.g., RS-232, Universal Serial Bus (USB) (e.g., USB 1.0, USB 1.1, USB 2.0, USB 3.0);

any other communication protocol such as, e.g., Infrared Data Association (IrDA).

In an embodiment, the first input/output interface 610 is a USB interface (in alternative embodiments, the first input/output interface 610 may be configured in accordance with any other communication protocol such as, e.g., in accordance with a communication protocol which has been described above).

In an embodiment, the computer arrangement 602 optionally may include an additional digital signal processor (DSP) 616, which may be provided, e.g., for digital signal processing. Furthermore, the computer arrangement 602 may include additional communication modules (not shown) such as, e.g., one or a plurality of transmitters, one or a plurality of receivers, one or a plurality of antennas, and so on.

The computer arrangement 602 may also include additional components (not shown), which are desired or required in the respective application.

In an embodiment, some or all of the circuits or components provided in the computer arrangement 602 may be coupled with each other by means of one or a plurality of computer arrangement-internal connections 618 (for example, by means of one or a plurality of computer busses) configured to transmit data and/or control signals between the respectively coupled circuits or components.

Furthermore, as has been described above, the computer system 600, in accordance with an embodiment, may include the memory cell arrangement 620.

The memory cell arrangement 620 may in an embodiment be configured as an integrated circuit. The memory cell arrangement 620 may further be provided in a memory module having a plurality of integrated circuits, wherein at least one integrated circuit of the plurality of integrated circuits includes a memory cell arrangement 620, as will be described in more detail below. The memory module may be a stackable memory module, wherein some of the integrated circuit may be stacked one above the other. In an embodiment, the memory cell arrangement 620 is configured as a memory card.

In an embodiment, the memory cell arrangement 620 may include a memory cell arrangement controller 622 (for example, implemented by means of hard wired logic and/or by means of one or a plurality of programmable processors, e.g., by means of one or a plurality of programmable processors such as, e.g., one or a plurality of programmable microprocessors (e.g., CISC (complex instruction set computer) microprocessor(s) or RISC (reduced instruction set computer) microprocessor(s)).

The memory cell arrangement 620 may further include a memory 624 having a plurality of memory cells. The memory 624 will be described in more detail below.

In an embodiment, the memory cell arrangement controller 622 may be coupled with the memory 624 by means of various connections. Each of the connections may include one or a plurality of lines and may thus have a bus width of one or a plurality of bits. Thus, by way of example, an address bus 626 may be provided, by means of which one or a plurality of addresses of one or a plurality of memory cells may be provided by the memory cell arrangement controller 622 to the memory 624, on which an operation (e.g., an erase operation, a write operation, a read operation, an erase verify operation, or a write verify operation, etc.) should be carried out. Furthermore, a data write connection 628 may be provided, by means of which the information to be written into the respectively addressed memory cell may be supplied by the memory cell arrangement controller 622 to the memory 624. Furthermore, a data read connection 630 may be provided, by means of which the information stored in the respectively addressed memory cell may be read out of the memory 624 and may be supplied from the memory 624 to the memory cell arrangement controller 622 and via the memory cell arrangement controller 622 to the computer arrangement 602, or, alternatively, directly to the computer arrangement 602 (in which case the first input/output interface 610 would directly be connected to the memory 624). A bidirectional control/state connection 632 may be used for providing control signals from the memory cell arrangement controller 622 to the memory 624 or for supplying state signals representing the state of the memory 624 from the memory 624 to the memory cell arrangement controller 622.

In an embodiment, the memory cell arrangement controller 622 may be coupled to the first input/output interface 610 by means of a communication connection 634 (e.g., by means of a USB communication connection).

In an embodiment, the memory 624 may include one chip or a plurality of chips. Furthermore, the memory cell arrangement controller 622 may be implemented on the same chip (or die) as the components of the memory 624 or on a separate chip (or die).

Figure 7:
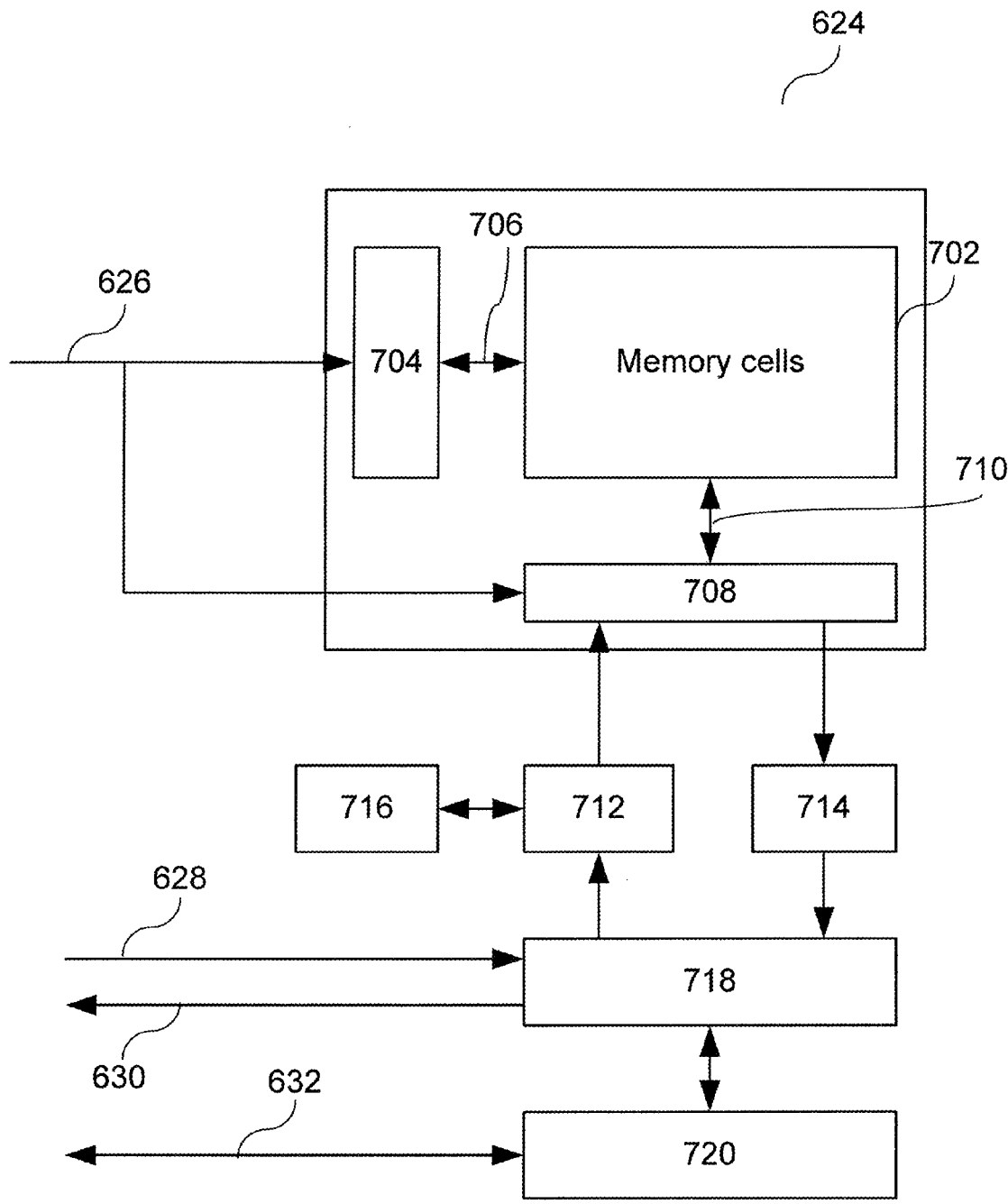
FIG. 7 shows a memory in accordance with an embodiment.

FIG. 7 shows the memory 624 of FIG. 6 in accordance with an embodiment in more detail.

In an embodiment, the memory 624 may include a memory cell field (e.g., a memory cell array) 702 having a plurality of memory cells. The memory cells may be arranged in the memory cell field 702 in the form of a matrix in rows and columns, or, alternatively, for example, in zig zag form. In other embodiments, the memory cells may be arranged within the memory cell field 702 in any other manner or architecture.

In general, each memory cell may, for example, be coupled with a first control line (e.g., a word line) and with at least one second control line (e.g., at least one bit line).

In an embodiment, in which the memory cells are arranged in the memory cell field 702 in the form of a matrix in rows and columns, a row decoder circuit 704 configured to select at least one row control line (e.g., a word line) of a plurality of row control lines 706 in the memory cell field 702 may be provided as well as a column decoder circuit 708 configured to select at least one column control line (e.g., a bit line) of a plurality of column control lines 710 in the memory cell field 702.

In an embodiment, the memory cells are non-volatile memory cells.

A "non-volatile memory cell" may be understood as a memory cell storing data even if it is not active. In an embodiment, a memory cell may be understood as being not active, e.g., if current access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months. Alternatively, the data may not need to be refreshed at all in some designs.

The non-volatile memory cells may be memory cells selected from a group of memory cells consisting, e.g., of:
charge storing random access memory memory cells (e.g., floating gate memory cells or charge trapping memory cells);
ferroelectric random access memory memory cells (FeRAM, FRAM);
magnetoresistive random access memory memory cells (MRAM);
phase change random access memory memory cells (PCRAM, for example, so called Ovonic Unified Memory (OUM) memory cells);
conductive filament random access memory memory cells (e.g., conductive bridging random access memory memory cells (CBRAM), also referred to as programmable metallization cells (PMC), or carbon-based conductive filament random access memory memory cells);
organic random access memory memory cells (ORAM);
nanotube random access memory memory cells (NRAM) (e.g., carbon nanotube random access memory memory cells);
nanowire random access memory memory cells.

In alternative embodiments, also other types of non-volatile memory cells may be used, e.g., any type of non-volatile memory cells which are subject to read disturb failures and/or retention failures.

In various embodiments, the memory cells may be resistive memory cells.

Furthermore, the memory cells may be electrically erasable read only memory memory cells (EEPROM).

In an embodiment, the memory cells may be Flash memory cells, e.g., charge storing memory cells such as, e.g., floating gate memory cells or charge trapping memory cells.

In an embodiment, each charge trapping memory cell includes a charge trapping layer structure for trapping electrical charge carriers. The charge trapping layer structure may include one or a plurality of two separate charge trapping regions. In an embodiment, the charge trapping layer structure includes a dielectric layer stack including at least one dielectric layer or at least two dielectric layers being formed above one another, wherein charge carriers can be trapped in at least one dielectric layer. By way of example, the charge trapping layer structure includes a charge trapping layer, which may include or consist of one or more materials being selected from a group of materials that consists of: aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In one embodiment, the charge trapping layer structure includes a dielectric layer stack including three dielectric layers being formed above one another, e.g., a first oxide layer (e.g., silicon oxide), a nitride layer as charge trapping layer (e.g., silicon nitride) on the first oxide layer, and a second oxide layer (e.g., silicon oxide or aluminum oxide) on the nitride layer. This type of dielectric layer stack is also referred to as ONO layer stack. In an alternative embodiment, the charge trapping layer structure includes two, four or even more dielectric layers being formed above one another.

In an embodiment, the memory cells may be multi-bit memory cells. As used herein the term "multi-bit" memory cell is intended to, e.g., include memory cells which are configured to store a plurality of bits by spatially separated electric charge storage regions or current conductivity regions, thereby representing a plurality of logic states.

In another embodiment, the memory cells may be multi-level memory cells. As used herein the term "multi-level" memory cell is intended to e.g., include memory cells which are configured to store a plurality of bits by showing distinguishable voltage or current levels dependent on the amount of electric charge stored in the memory cell or the amount of electric current flowing through the memory cell, thereby representing a plurality of logic states.

In an embodiment, address signals are supplied to the row decoder circuit 704 and the column decoder circuit 708 by means of the address bus 626, which is coupled to the row decoder circuit 704 and to the column decoder circuit 708. The address signals uniquely identify at least one memory cell to be selected for an access operation (e.g., for one of the above described operations). The row decoder circuit 704 selects at least one row and thus at least one row control line 706 in accordance with the supplied address signal. Furthermore, the column decoder circuit 708 selects at least one column and thus at least one column control line 710 in accordance with the supplied address signal.

The electrical voltages that are provided in accordance with the selected operation, e.g., for reading, programming (e.g., writing) or erasing of one memory cell or of a plurality of memory cells, are applied to the selected at least one row control line 706 and to the at least one column control line 710.

In the case that each memory cell is configured in the form of a field effect transistor (e.g., in the case of a charge storing memory cell), in an embodiment, the respective gate terminal is coupled to the row control line 706 and a first source/drain terminal is coupled to a first column control line 710. A second source/drain terminal may be coupled to a second column control line 710. Alternatively, with a first source/drain terminal of an adjacent memory cell, which may then, e.g., also be coupled to the same row control line 706 (this is the case, e.g., in a NAND arrangement of the memory cells in the memory cell field 702). However, it should be mentioned that alternative embodiments may be provided, in which the memory cells are, e.g., arranged in accordance with a NOR arrangement of the memory cells in the memory cell field 702.

In an embodiment, by way of example, for reading or for programming, a single row control line 706 and a single column control line 710 are selected at the same time and are appropriately driven for reading or programming of the thus selected memory cell. In an alternative embodiment, it may be provided to respectively select a single row control line 706 and a plurality of column lines 710 at the same time for reading or for programming, thereby allowing to read or program a plurality of memory cells at the same time.

Furthermore, in an embodiment, the memory 624 includes at least one write buffer memory 712 and at least one read buffer memory 714. The at least one write buffer memory 712 and the at least one read buffer memory 714 are coupled with the column decoder circuit 708. Depending on the type of memory cell, reference memory cells 716 may be provided for reading the memory cells.

In order to program (e.g., write) a memory cell, the data to be programmed may be received by a data register 718, which is coupled with the data write connection 628, by means of the data write connection 628, and may be buffered in the at least one write buffer memory 712 during the write operation.

In order to read a memory cell, the data read from the addressed memory cell (represented, e.g., by means of an electrical current, which flows through the addressed memory cell and the corresponding column control line 710, which may be compared with a current threshold value in order to determine the content of the memory cell, wherein the current threshold value may e.g. be dependent from the reference memory cells 716) are e.g. buffered in the read buffer memory 714 during the read operation. The result of the comparison and therewith the logic state of the memory cell (wherein the logic state of the memory cell represents the memory content of the memory cell) may then be stored in the data register 718 and may be provided via the data read connection 630, with which the data register 718 may be coupled.

The access operations (e.g., write operations, read operations, or erase operations) may be controlled by a memory-internal controller 720, which in turn may be controlled by the memory cell arrangement controller 622 by means of the bidirectional control/state connection 632. In an alternative embodiment, the data register 718 may directly be connected to the memory cell arrangement controller 622 by means of the bidirectional control/state connection 632 and thus directly controlled thereby. In this example, the memory-internal controller 720 may be omitted.

In an embodiment, the memory cells of the memory cell field may be grouped into memory blocks or memory sectors, which may be commonly erased in an erase operation. In an embodiment, there are so many memory cells included in a memory block or memory sector such that the same amount of data may be stored therein as compared with a conventional hard disk memory sector (e.g., 512 byte), although a memory block or memory sector may alternatively also store another amount of data.

Furthermore, other common memory components (e.g., peripheral circuits such as, e.g., charge pump circuits, etc.) may be provided in the memory 624, but they are neither shown in FIG. 6 nor FIG. 7 for reasons of clarity.

Figure 8:
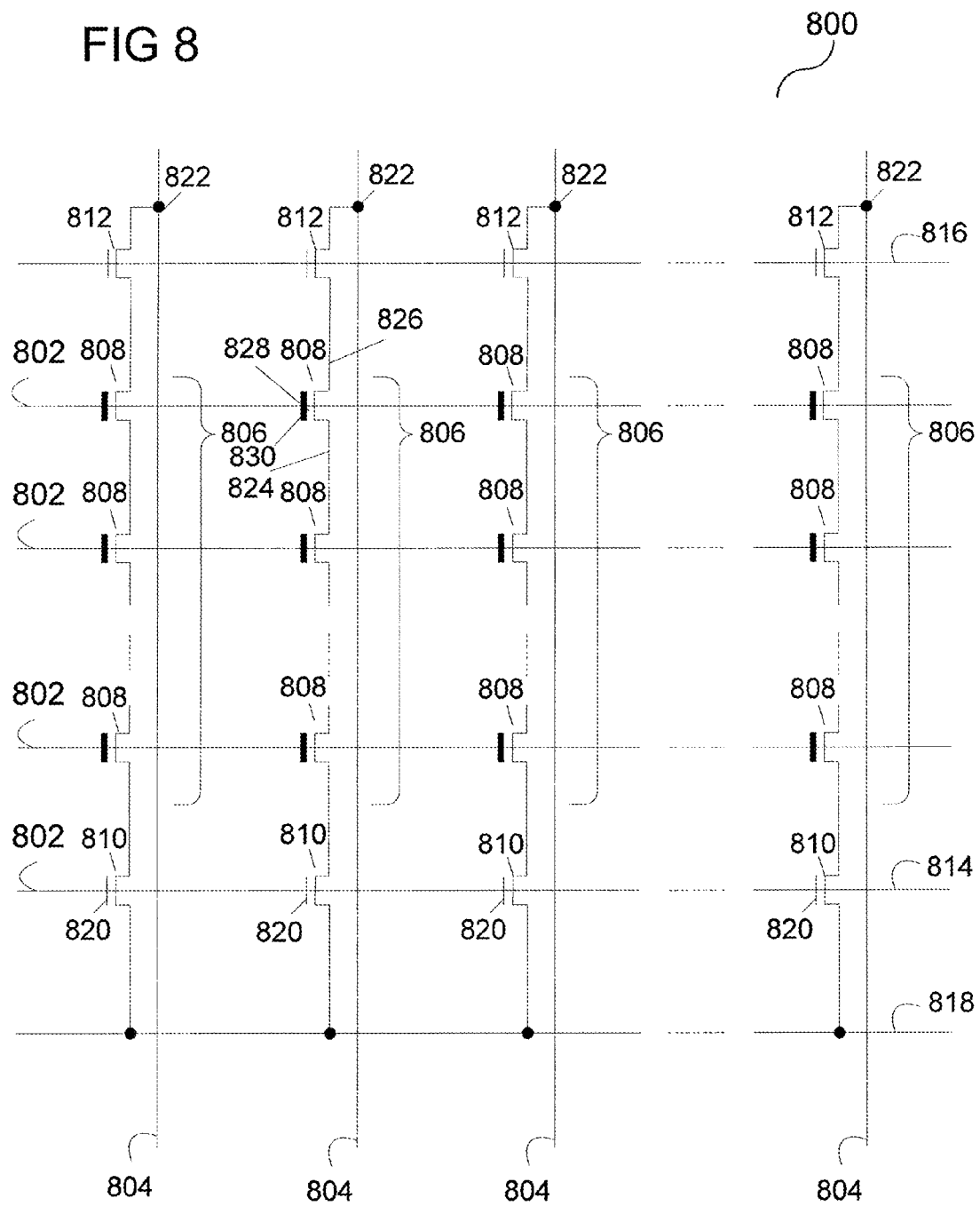
FIG. 8 shows an example of the memory cell field of FIG. 2 in accordance with an embodiment.

FIG. 8 shows a memory cell portion 800 of the memory cell field 702 in accordance with an embodiment.

In one embodiment, the memory cell portion 800 is arranged as a NAND memory cell field (although another coupling architecture (e.g., a NOR coupling architecture) may be provided in an alternative embodiment).

In an embodiment, the NAND memory cell portion 800 (e.g., a NAND memory cell array portion 800) may include word lines 802 (in general, an arbitrary number of word lines 802, in one embodiment, 1024 word lines 802) and intersecting bit lines 804 (in general, an arbitrary number of bit lines 804, in one embodiment, 512 bit lines 804).

The NAND memory cell array portion 800 may include NAND strings 806, each NAND string 806 having memory cells 808 (e.g., charge storing memory cells 808 such as, e.g., charge trapping memory cells 808 or floating gate memory cells 808). Furthermore, an arbitrary number of memory cells 808 can be provided in the NAND string 806, in accordance with one embodiment, 32 memory cells 808. The memory cells 808 are connected in series source-to-drain between a source select gate 810, which may be implemented as a field effect transistor, and a drain select gate 812, which may also be implemented as a field effect transistor. Each source select gate 810 is positioned at an intersection of a bit line 804 and a source select line 814. Each drain select gate 812 is positioned at an intersection of a bit line 804 and a drain select line 816. The drain of each source select gate 810 is connected to the source terminal of the first charge trapping memory cells 808 of the corresponding NAND string 806. The source of each source select gate 810 is connected to a common source line 818. A control gate 820 of each source select gate 810 is connected to the source select line 814.

In one embodiment, the common source line 818 is connected between source select gates 810 for NAND strings 806 of two different NAND arrays. Thus, the two NAND arrays share the common source line 818.

In an embodiment, the drain of each drain select gate 812 may be connected to the bit line 804 of the corresponding NAND string 806 at a drain contact 822. The source of each drain select gate 812 is connected to the drain of the last charge trapping memory cell 808 of the corresponding NAND string 806. In one embodiment, at least two NAND strings 806 share the same drain contact 822.

In accordance with the described embodiments, each memory cell 808 may include a source 824 (e.g., a first source/drain region), a drain 826 (e.g., a second source/drain region), a charge storage region 828 (e.g., a floating gate stack or a dielectric layer stack) and a control gate 830 (e.g., a gate region). The control gate 830 of each memory cell 808 may be connected to a respective word line 802. A column of the NAND memory cell array portion 800 may include a respective NAND string 806 and a row of the NAND memory cell array portion 800 may include those memory cells 808 that are commonly connected to a respective word line 802.

In an alternative embodiment, the memory cell portion 800 is a NOR memory cell array portion 800. In yet another embodiment, the memory cell portion 800 may be arranged in accordance with any other suitable architecture.

The described methods for reading memory cells, for programming memory cells and for erasing memory cells may be implemented in part or in full, e.g., by the memory cell arrangement controller 622 or, e.g., by the memory-internal controller 720 or by another control logic configured to implement the respective method.

In various embodiments, it has been realized that just increasing the number of allowed failing memory cells for a successful program operation or a successful erase operation would probably not be sufficient in future developments of memory cell block management. It has been realized that this may be due to the fact that a weak memory cell block (e.g., a memory cell block that, e.g., has undergone or seen many erase-program operation cycles or have weaker memory cells from the beginning of its manufacture or is somehow else affected, e.g., bit line weakness or word line weakness) may be programmed without an occurring failure but may still be very vulnerable to a read disturb failure or a retention failure causing data loss.

In an embodiment, a memory cell block may include a plurality of memory cells, e.g., a plurality of memory cells which undergo a similar operation history. In an example, a memory cell block may be an erase sector, in other words, e.g., a plurality of memory cells which are erased together. However, in alternative embodiments, a memory cell block may include any number of memory cells grouped together and may, e.g., be a memory page, a NAND memory cell string, etc.

Figure 9:
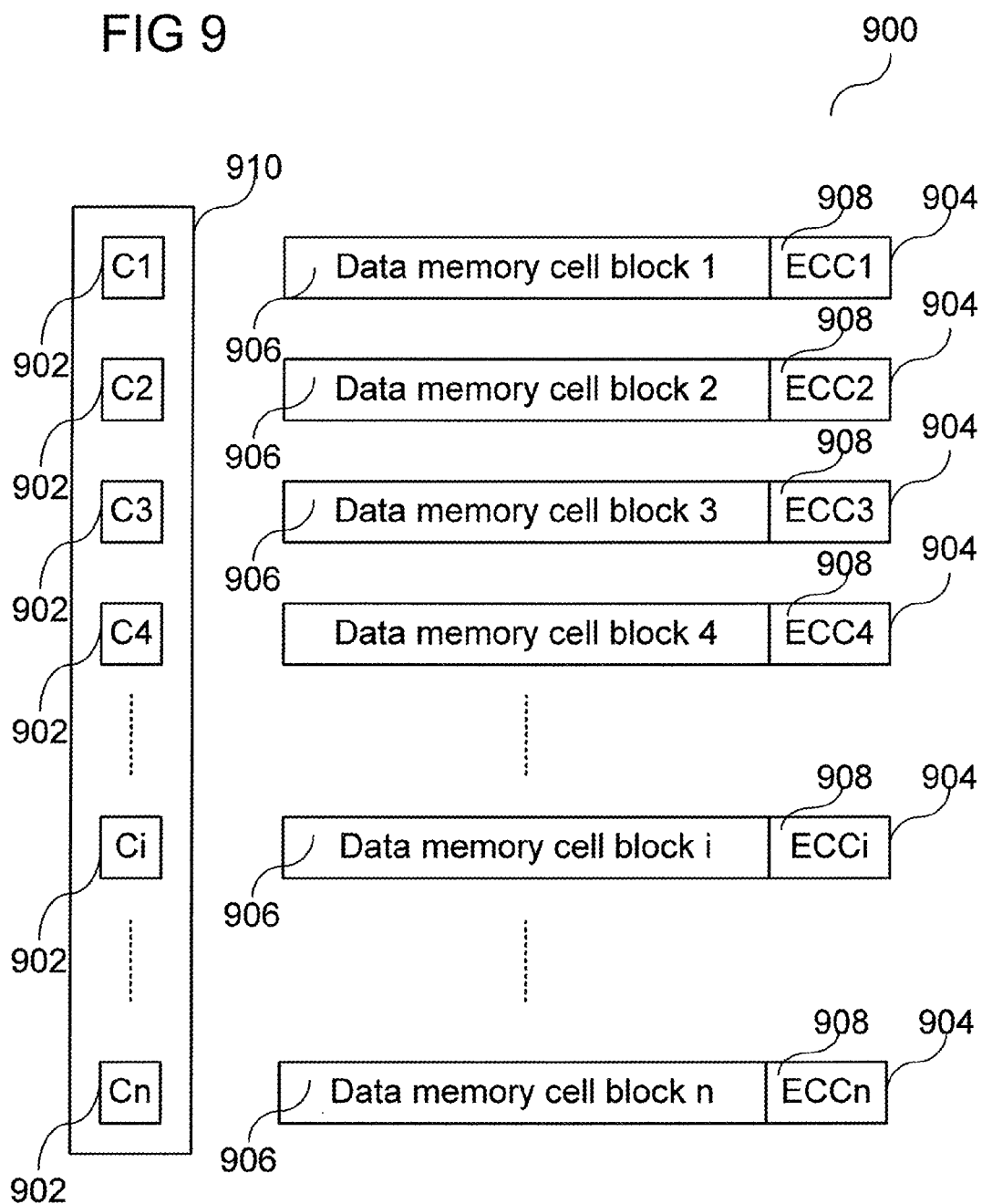
FIG. 9 shows an example of a plurality of counters, each counter being assigned to a respective memory cell block, in accordance with an embodiment.

FIG. 9 shows an example of a portion 900 of a memory cell field including a plurality of counters Ci 902 (i=1, . . . , n, with n being an arbitrary integer value), each counter Ci 902 being assigned to a respective memory cell block i 904, in accordance with an embodiment to a respective erase sector i 904. In an example, each memory cell block i 904 may include a data portion (also referred to as data memory cell block i) 906 and a corresponding error correction code portion (also referred to as ECCi) 908. The data portion 906 may include the actually stored useful data and the error correction code portion 908 may include an error correction code value representing the result of an error correction algorithm applied to the data stored in the data portion 906 of a respective memory cell block i 904. The plurality of counters Ci 902 may be stored together in a counter table 910, which may be stored in a comprehensive manner in one storage portion (which may be implemented in the same memory or in another memory, even outside the memory cell arrangement 620, e.g., in a memory of the computer arrangement 602). Alternatively, the counters Ci 902 may be stored in a distributed manner, e.g., such that a respective counter Ci 902 may be stored in the assigned memory cell block i 904 itself, e.g., in a spare area of a specific memory page of the assigned memory cell block i 904. It should be mentioned that in an example, each counter Ci 902 only needs a small number of bits, e.g., two to five bits, e.g., three to four bits, and, therefore, the counter table 910 may be stored in one memory page for fast download to the respective controller (e.g., memory cell arrangement controller 622 or memory-internal controller 720). In an example, the counter table 910 may be used for carrying out wear leveling by favoring memory cell blocks i 904 having the highest counter values. However, as mentioned above, the counter Ci 902 could also be stored on the assigned memory cell block i 904 itself, e.g., in the spare area of a specific memory page. In this example, no entire counter table 910 would be required to be stored or organized by the controller. However, in this example, each erase operation would then require a read operation in order to get the actually updated counter value of the respective counter Ci 902.

Figure 10:
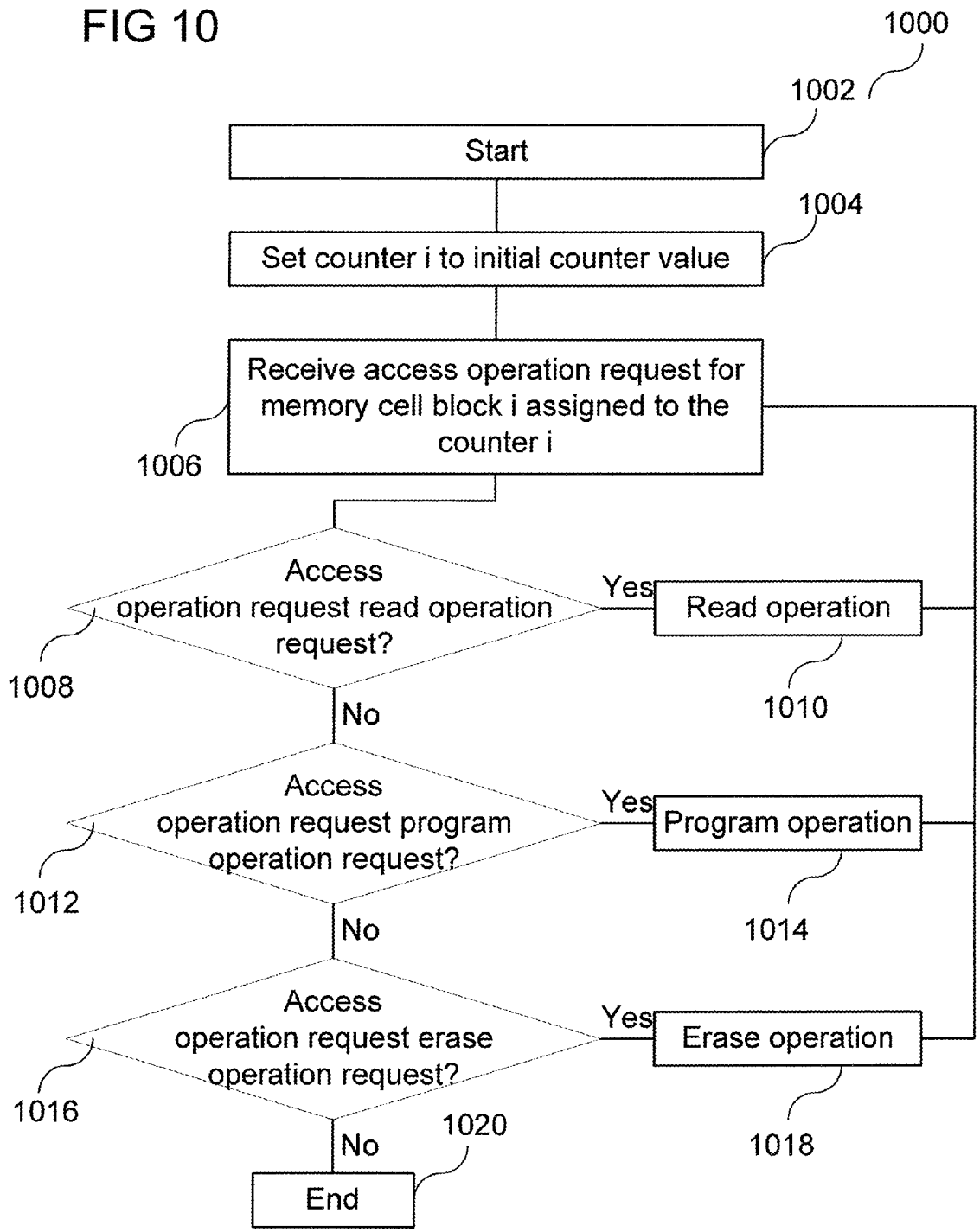
FIG. 10 shows an example of a method of operating a memory cell arrangement in accordance with an embodiment in a flow diagram.

FIG. 10 shows an example of a method of operating a memory cell arrangement in accordance with an embodiment in a flow diagram 1000. It should be mentioned that the described concrete values are merely examples and may vary depending on the respective type of memory cells or the memory cell architecture, for example.

After having started the method in 1002, e.g., after having booted the memory cell arrangement and the included controllers, in 1004, each counter Ci 902 may be set to an initial counter value. The initial counter values of different counters Ci 902 may be selected to be different from each other, e.g., depending on the quality of the respectively assigned memory cell block i 904. In another example, process 1004 may be provided only once at the beginning of the lifetime of the memory cell arrangement 620. In any case, the initializing of the counters Ci 902 is optional.

In an implementation, the initial counter values may be determined using information collected during a test of the memory cell arrangement 620. By way of example, the initial counter values may be determined such that all memory cells of a respective memory cell block i 904 are programmed and then erased using a fixed (weaker than used in a normal mode erase operation) erase pulse, followed by a measuring of the threshold values of the memory cells of the respective memory cell block i 904 and then determining the number of memory cells of the respective memory cell block i 904, the threshold voltage of which is above or below a predefined reference threshold voltage. In another example, the initial counter values may be determined such that all memory cells of a respective memory cell block i 904 are programmed using a fixed predefined programming pulse followed by a determination of the threshold voltage distribution width. The determined threshold voltage distribution width then may be used for classification of the respective memory cell block i 904 and depending on the classification, for the selecting and setting of the initial counter values. In an example, the initial counter values may be set to a value "8".

Then, in 1006, an access operation request for the respective memory cell block i 904 that is assigned to the respective counter Ci 902, may be received by the controller.

Next, the type of the received access operation request may be determined.

By way of example, in 1008, it may be determined whether the received access operation request is a read operation request. In case the received access operation request is a read operation request ("Yes" in 1008), in 1010, a read operation will be carried out, examples of which will be described in more detail below. Then, the process may continue in 1006, waiting for the next received access operation request. In case the received access operation request is not a read operation request ("No" in 1008), the process continues in 1012, in which it may be determined whether the received access operation request is a program operation request. In case the received access operation request is a program operation request ("Yes" in 1012), in 1014, a program operation will be carried out, examples of which will be described in more detail below. Then, the process may continue in 1006, waiting for the next received access operation request. In case the received access operation request is not a program operation request ("No" in 1012), the process continues in 1016, in which it may be determined whether the received access operation request is an erase operation request. In case the received access operation request is an erase operation request ("Yes" in 1016), in 1018, an erase operation will be carried out, examples of which will be described in more detail below. Then, the process may continue in 1006, waiting for the next received access operation request. In case the received access operation request is not an erase operation request ("No" in 1016), the process may end in 1020 (in an alternative example, an error message may be generated and presented to the user of the memory cell arrangement 620.

It is to be noted that the described processes (e.g., the processes 1008, 1012, 1016) may be carried out in a different order.

Figure 11:
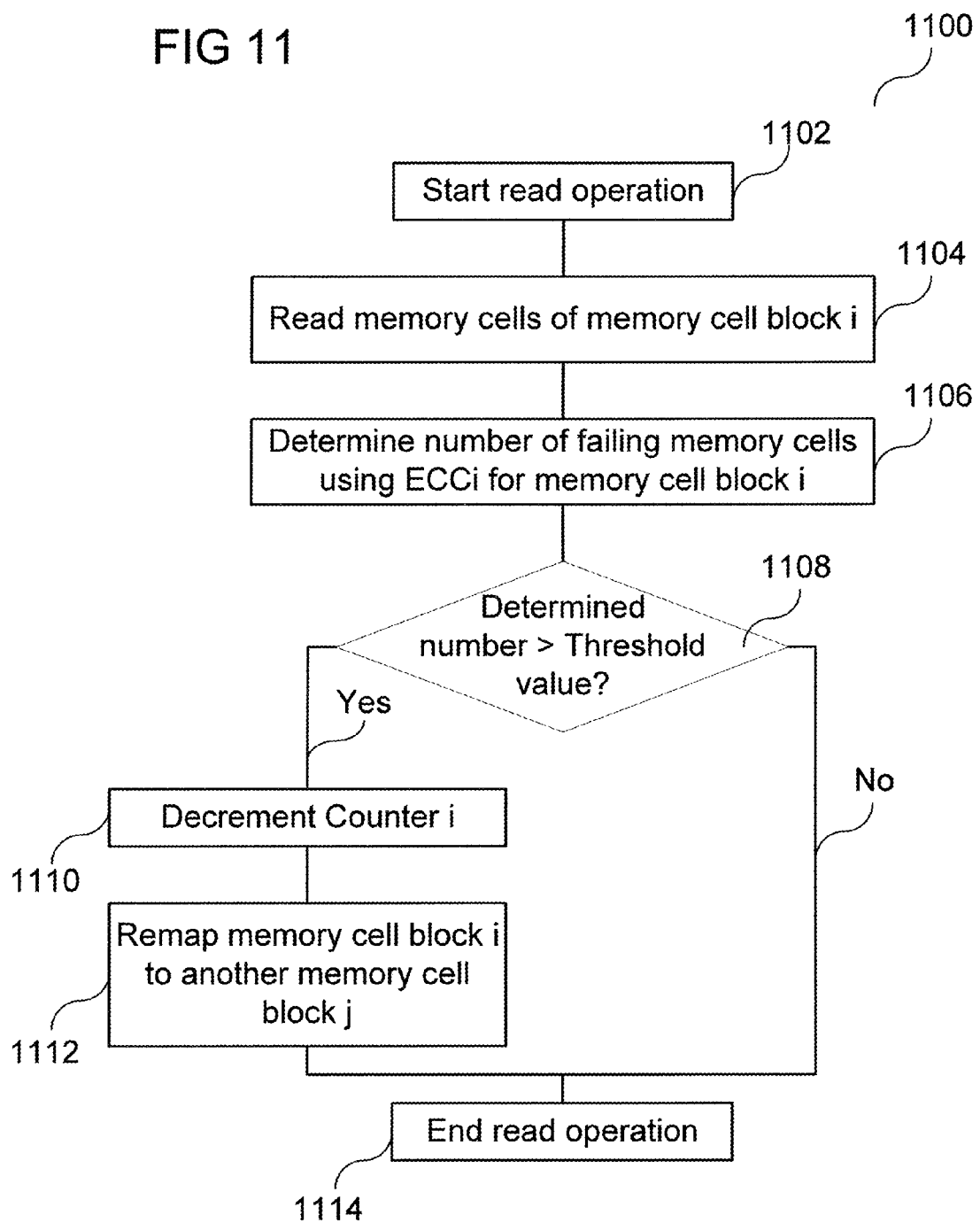
FIG. 11 shows an example of a read operation in accordance with an embodiment in a read flow diagram.

FIG. 11 shows an example of a read operation 1010 in accordance with an embodiment in a read flow diagram 1100 in more detail.

After having started the read operation in 1102, in 1104, the memory cells of the requested memory cell block i 904 are read (in other words, the content of the memory cells of the requested memory cell block i 904 is determined). In an implementation, a plurality of memory cells or all memory cells of the memory cell block may be read in 1104. Then, using the error correction code value stored in the error correction code portion 908 of the memory cell block i 904, the number of failing memory cells in the read memory cell block i 904 may be determined in 1106. Next, in 1108, it may be determined as to whether the determined number of failing memory cells in the read memory cell block i 904 is greater than a predefined failure threshold value (in an alternative example, in 1108, it may be determined as to whether the determined number of failing memory cells in the read memory cell block i 904 is equal to or greater than the predefined failure threshold value). This criterion may be an example of a read criterion. In an example, a 16 bit ECC may be used and stored in the error correction code portion 908, and the predefined failure threshold value may be set to "12". In case the determined number of failing memory cells in the read memory cell block i 904 is greater than the predefined failure threshold value ("Yes" in 1108), in 1110, the counter value of the respective counter Ci 902 is decremented, e.g., by a predefined value, e.g., by the value "1". Then, in 1112, the memory cell block i 904 may be remapped (in other words copied) to another memory cell block 904 (which may have a higher quality). It is to be noted that in an example, in 1112, the respective memory cell block i 904 is not marked as being a bad memory cell block 904. Then, the process may end in 1114. In case the determined number of failing memory cells in the read memory cell block i 904 is not greater than the predefined failure threshold value ("No" in 1108), the process may also end in 1114.

Figure 12:
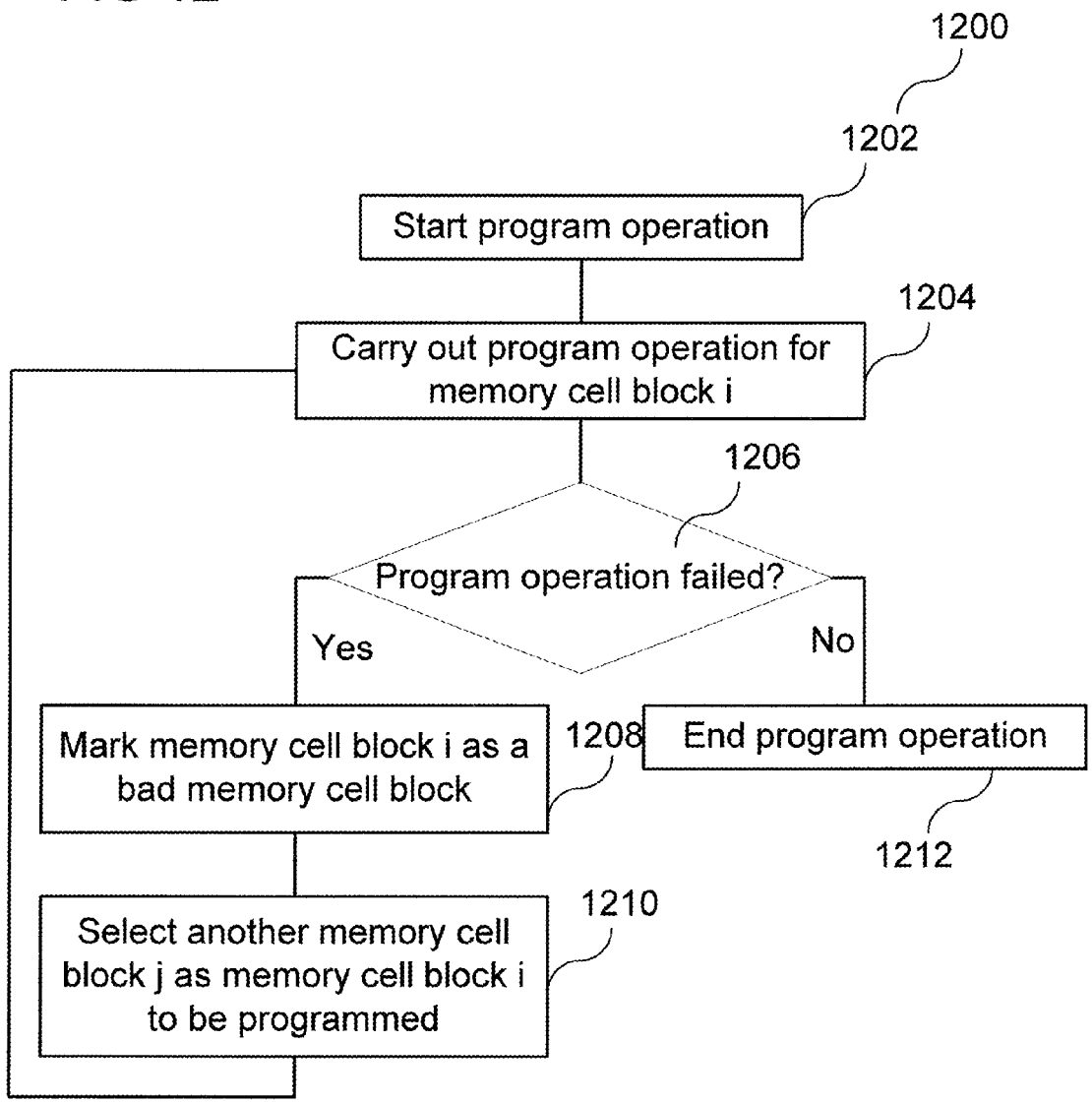
FIG. 12 shows an example of a program operation in accordance with an embodiment in a program flow diagram.

FIG. 12 shows an example of a program operation 1014 in accordance with an embodiment in a program flow diagram 1200 in more detail.

After having started the program operation in 1202, in 1204, the one or more memory cells of the requested memory cell block i 904 are programmed (in other words, the content of the one or more memory cells to be programmed of the requested memory cell block i 904 is/are programmed). Then, in 1206, it is determined as to whether the program operation 1014 has been completed successfully or whether the program operation 1014 has failed. In case that the program operation 1014 has failed ("Yes" in 1206), in 1208, the memory cell block i 404 is marked or classified as a bad memory cell block 904. Then, in 1210, another memory cell block j 904 is selected as a new memory cell block i 904 to be programmed (illustratively, i:=j), and the process continues in 1204, where the program operation is carried out on the new selected memory cell block i 904. In case that the program operation 1014 has not failed ("No" in 1206), the process may end in 1212. Illustratively, the program operation may be implemented as a conventional program operation, in which the memory cell block 904 to be programmed is marked as a bad memory cell block 904 in case the program operation fails. In this example, the assumption may be made that the program operation fail is only provided in case that the number of failing bits (or failing memory cells) exceeds a predefined value. In case this assumption does not apply, an additional read operation may be provided to verify the data after a program-fail and the process may continue with the read operation as described above.

Figure 13:
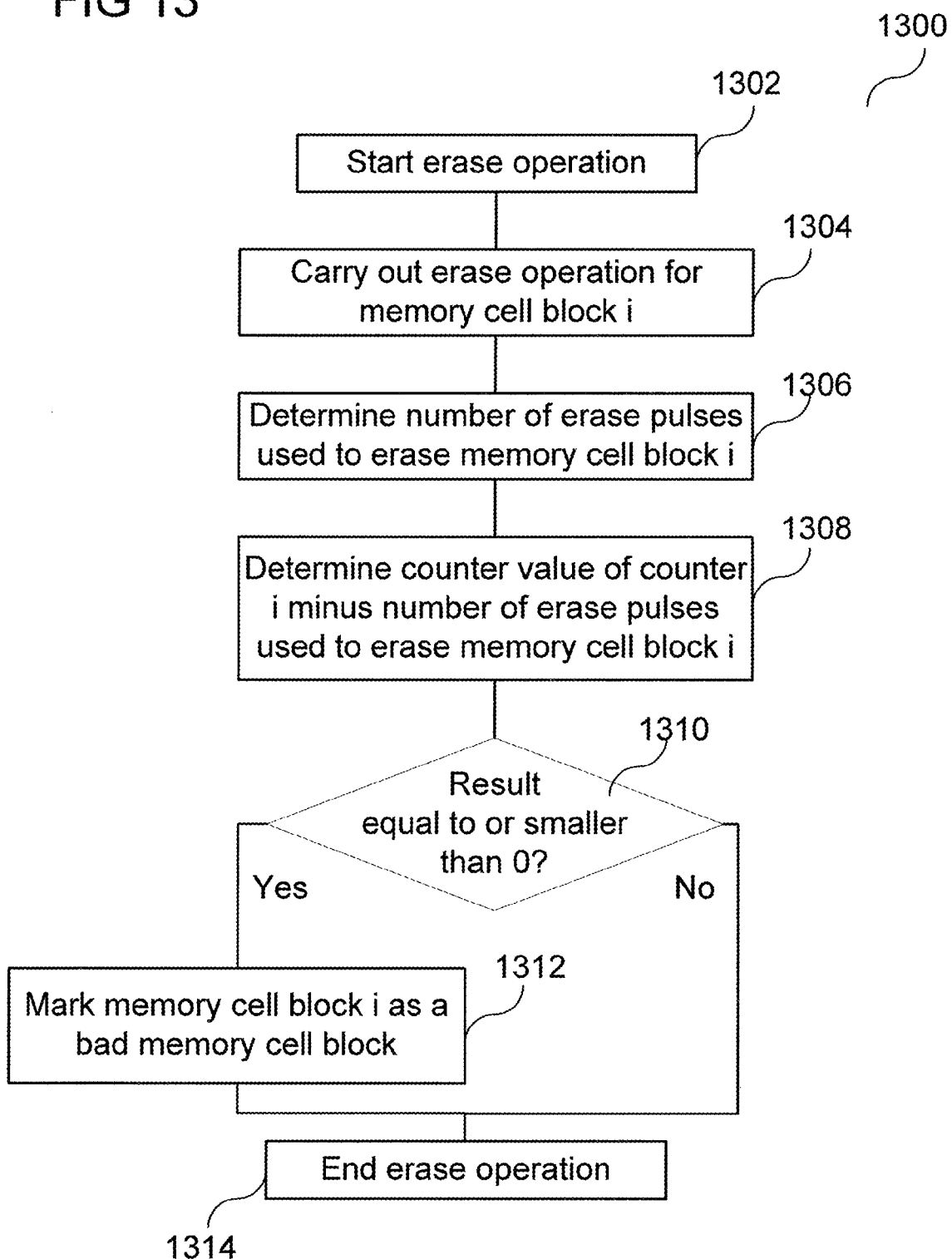
FIG. 13 shows an example of an erase operation in accordance with an embodiment in an erase flow diagram.

FIG. 13 shows an example of an erase operation 1018 in accordance with an embodiment in an erase flow diagram 1300 in more detail.

After having started the erase operation in 1302, in 1304, the memory cells of the requested memory cell block i 904 are erased. Then, in 1306, the number of provided or required erase pulses to erase the memory cells of the requested memory cell block i 904 may be determined. Illustratively, it has been realized that the number of provided or required erase pulses in the erase operation may be interpreted as the age of the respective memory cell block i 904. In an example, it has been realized that the older a memory cell block i 904 is, the easier the memory cells of the memory cell block i 904 may be programmed, and the more difficult the memory cells of the memory cell block i 904 may be erased, in other words, e.g., the more erase pulses may be required to erase the memory cells of the memory cell block i 904. Next, in this example, in 1308, a difference between the counter value of the counter Ci 902 and the determined number of provided or required erase pulses in the erase operation may be determined or calculated. Then, in 1310, it is determined as to whether the difference is equal to or smaller than "0" (as an example of an erase criterion). In case the difference is equal to or smaller than "0" ("Yes" in 1310), in 1312, the memory cell block i 904 is marked or classified as a bad memory cell block i 904, and then the erase operation may end in 1314. In case the difference is greater than "0" ("No" in 1310), the erase operation may end in 1314.

It should be noted that in an embodiment, it may further be determined as to whether the erase operation 1018 has been completed successfully or whether the erase operation 1018 has failed. In case that the erase operation 1018 has failed (not shown in FIG. 13), the memory cell block i 904 may be marked or classified as a bad memory cell block 904.

In accordance with various embodiments, as described above, the counters Ci 902 may have a small number of bits (compared with counters counting the program-erase cycles) and do not need to be updated after each program-erase cycle.

Illustratively, in accordance with various embodiments, as described above, for a memory cell block i 904 including weak memory cells (weak because of any reason), the counter value of the respective counter Ci 902 gets decremented faster than for a memory cell block i 904 with good memory cells. Thus, a read disturb may need a huge number of read operations on good memory cells to show any effect. The same applies for the retention of data in the memory cells of the memory cell block i 904.

In various embodiments, a new counter may be provided for each memory cell block to measure the quality of the associated memory cell block. In various embodiments, a new methodology for Bad-Block-Management, e.g., in a non-volatile memory device, may be provided. In various embodiments, the number of needed erase pulses in an erase operation within the non-volatile memory device may be provided. In an alternative implementation, instead of the number of erase pulses needed for an erase operation, the time needed for the erase operation may be measured (e.g., the so-called ready/busy-time) and may be "translated" into the memory cell block endurance. Furthermore, in various embodiments, a special ECC margin may be provided and used to copy a still correctable memory cell block to another (e.g., a new, in other words, unused) memory cell block. Moreover, in various embodiments, the counters Ci 902 may be used to sort the memory cell block for improved wear leveling.

In various embodiments, the overall lifetime of the memory cell arrangement may be increased.

In an alternative implementation, it may be provided that the counters are not decremented, but incremented starting, e.g., from the respective initial counter value, and it may be determined as to whether the values exceed a respectively selective threshold value.

Figure 14A:
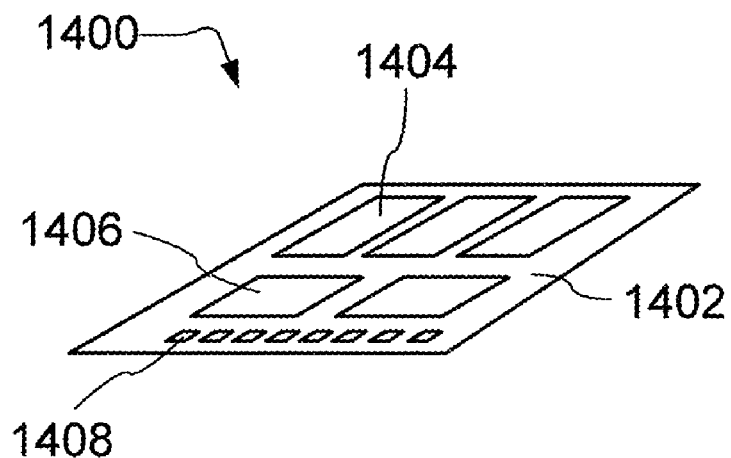
FIGS. 14A and 14B show a memory module (FIG. 14A) and a stackable memory module (FIG. 14B) in accordance with an embodiment.
Figure 14B:
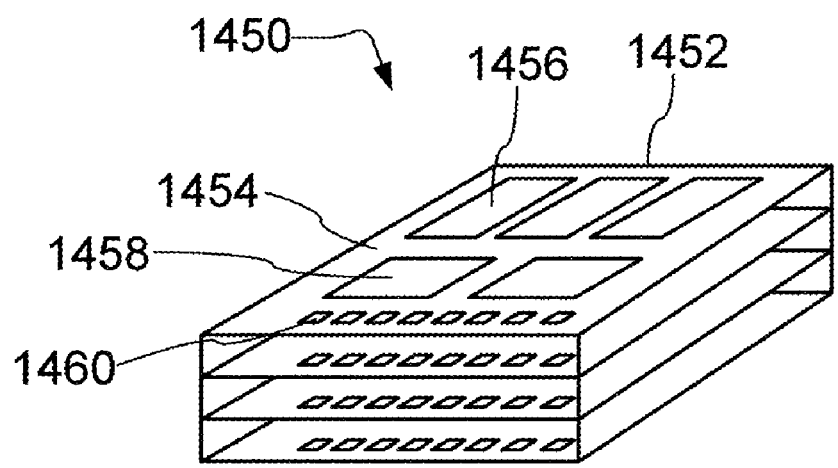

As shown in FIGS. 14A and 14B, in some embodiments, memory devices such as those described herein may be used in modules.

In FIG. 14A, a memory module 1400 is shown, on which one or more memory devices 1404 are arranged on a substrate 1402. The memory device 1404 may include numerous memory cells, each of which uses a memory element in accordance with an embodiment. The memory module 1400 may also include one or more electronic devices 1406, which may include memory, processing circuitry, control circuitry, addressing circuitry, bus interconnection circuitry, or other circuitry or electronic devices that may be combined on a module with a memory device, such as the memory device 1404. Additionally, the memory module 1400 includes multiple electrical connections 1408, which may be used to connect the memory module 1400 to other electronic components, including other modules.

As shown in FIG. 14B, in some embodiments, these modules may be stackable, to form a stack 1450. For example, a stackable memory module 1452 may contain one or more memory devices 1456, arranged on a stackable substrate 1454. The memory device 1456 contains memory cells that employ memory elements in accordance with an embodiment. The stackable memory module 1452 may also include one or more electronic devices 1458, which may include memory, processing circuitry, control circuitry, addressing circuitry, bus interconnection circuitry, or other circuitry or electronic devices that may be combined on a module with a memory device, such as the memory device 1456. Electrical connections 1460 are used to connect the stackable memory module 1452 with other modules in the stack 1450, or with other electronic devices. Other modules in the stack 1450 may include additional stackable memory modules, similar to the stackable memory module 1452 described above, or other types of stackable modules, such as stackable processing modules, control modules, communication modules, or other modules containing electronic components.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
    a memory cell arrangement, the memory cell arrangement comprising a plurality of memory cell blocks, each memory cell block comprising a plurality of memory cells;
    means for storing information about a quality characteristic of the memory cells of an assigned one of the memory cell blocks; and
    means for controlling a read operation on memory cells of a memory cell block out of the plurality of memory cells, wherein the means for controlling is further configured to change the information about the quality characteristic depending on a quality of a read operation,
    wherein the means for controlling a read operation is further configured to control an erase operation on memory cells of a memory cell block out of the plurality of memory cell blocks such that a current erase characteristic of the memory cells of the memory cell block is determined, and such that further depending on the determined current erase characteristic of the memory cells of the memory cell block, a predefined second action is carried out for the memory cell block.

2. The integrated circuit of claim 1, wherein the current erase characteristic is a number of erase pulses used for erasing the memory cells of the memory cell block.

3. The integrated circuit of claim 1, wherein the means for controlling a read operation is configured to control an erase operation such that the predefined second action is a classification of the memory cell block as a bad memory cell block.

4. An integrated circuit comprising a memory cell arrangement, the memory cell arrangement comprising:

a plurality of memory cell blocks, each memory cell block comprising a plurality of memory cells;

a storage portion configured to store information about a read failure characteristic of the memory cells of each memory cell block of the plurality of memory cell blocks;

a controller configured to control a read operation on memory cells of a memory cell block out of the plurality of memory cell blocks such that a current read failure characteristic of the memory cells of the memory cell block is determined; and a wear leveling circuit configured to select memory cell blocks for programming dependent on the stored information about a read failure characteristic of the memory cells of each memory cell block of the plurality of memory cell blocks.

* * * * *